(12) United States Patent
Baney

(10) Patent No.: US 10,749,495 B2
(45) Date of Patent: Aug. 18, 2020

(54) ADAPTIVE MATCHING NETWORK

(71) Applicant: Keysight Technologies, Inc., Santa Rosa, CA (US)

(72) Inventor: Douglas Baney, Santa Clara, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/828,358

(22) Filed: Aug. 17, 2015

(65) Prior Publication Data
US 2017/0054427 A1 Feb. 23, 2017

(51) Int. Cl.
*H03H 7/40* (2006.01)
*H03H 7/38* (2006.01)

(52) U.S. Cl.
CPC .............. *H03H 7/40* (2013.01); *H03H 7/383* (2013.01)

(58) Field of Classification Search
CPC ................................. H03H 7/40; H03H 7/383
USPC ....................................................... 333/17.3
See application file for complete search history.

(56) References Cited

U.S. PATENT DOCUMENTS

| 4,951,009 A * | 8/1990 | Collins .............. G01R 33/3628 333/17.3 |
| 6,037,650 A * | 3/2000 | Ioffe ....................... H01L 29/93 257/596 |
| 2006/0154641 A1 * | 7/2006 | Desclos ................. H03H 11/48 455/333 |
| 2009/0174496 A1 * | 7/2009 | Van Bezooijen ......... H03F 1/56 333/17.3 |
| 2011/0063042 A1 * | 3/2011 | Mendolia .................. H01P 5/04 333/17.3 |
| 2012/0256689 A1 * | 10/2012 | El Kaamouchi ......... H04B 1/04 330/185 |

OTHER PUBLICATIONS

Robert E. Anholt et al., "Experimental Investigation of the Temperature Dependence of GaAs FET Equivalent Circuits", IEEE Transactions on Electron Devices, vol. 39. No. 9, Sep. 1992, pp. 2029-2036.

* cited by examiner

*Primary Examiner* — Samuel S Outten

(57) ABSTRACT

An apparatus for acquiring a desired response to an electromagnetic signal includes an adaptive network that receives a feedback signal and dynamically adjusts an electrical characteristic of the adaptive network in response to the feedback signal, the adaptive network electrically cooperating with an electrical component. A measurement device measures a parameter indicative of a combined response by the electrical component and the adaptive network to an impinging electromagnetic signal. A processor identifies, in accordance with the measured parameter, the feedback signal that reduces the difference between a predetermined response and the combined response to the electromagnetic signal. A feedback generator generates the identified feedback signal and conveys the generated feedback signal to the adaptive network.

20 Claims, 8 Drawing Sheets

ADAPTIVE MATCHING NETWORK

BACKGROUND

Active devices employed as microwave amplifiers are typically designed to maximize overall gain. Conjugate matching networks are designed to interface microwave signals leading into the active device responsible for amplification, and the same for signals exiting the device. The matching networks are typically static, either via design or with post-fabrication tuning, in which reactive or resistive properties of the matching networks are tuned to optimize a property of the amplifier. Tuning may be accomplished, for example, by removing bond wires or scribing connections that lead to reactive or resistive elements to change net matching properties of the conjugate matching circuits. The amplifier matching networks then remain in a static state once this tuning is performed.

Rapid changes in properties of the active device, e.g., in response to the onset of heating effects, as well as other physical properties, result in changes to the amplifier performance. This can happen, for example, in a cell phone when suddenly the transmitted carrier power needs to increase. This increases the current through the amplifier and can lead to a change in amplifier performance. The timescales can be quite rapid and result in changes to the scattering parameters (S-parameters) ($S_{11}$ $S_{12}$ $S_{21}$ $S_{22}$) of the amplifier as well as its nonlinear properties.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

In the drawings.

DETAILED DESCRIPTION

Figure 1A:
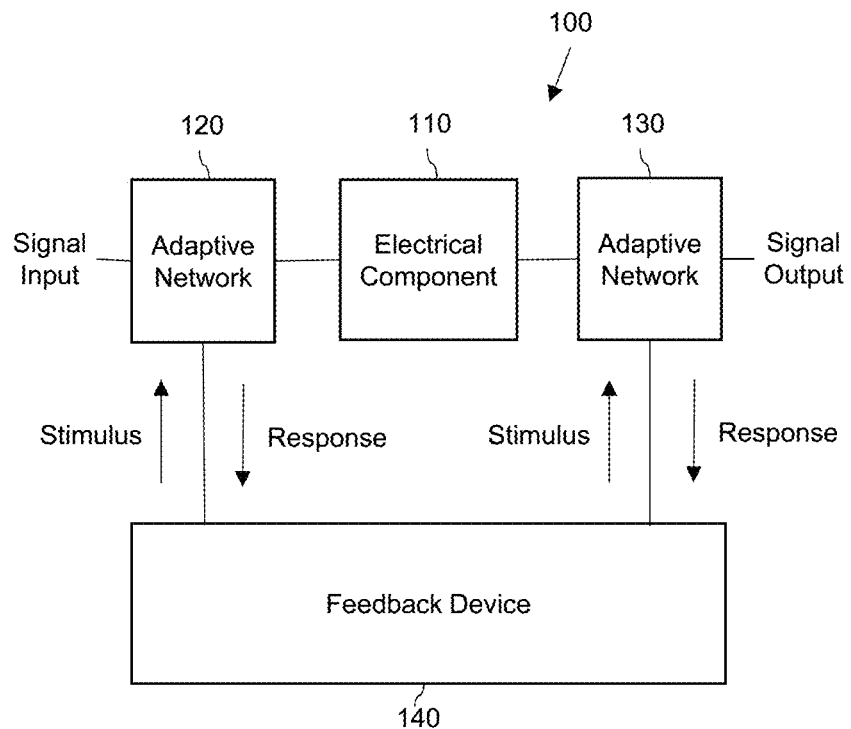
FIG. 1A illustrates a system for dynamically adapting a network to an electrical component, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

In an embodiment of the disclosure, scattering parameters are monitored at the germane ports of an impedance-matching network, the impedance characteristic of which is to be corrected, and used to generate a feedback signal that changes a property or properties of the matching network as a function of time. For example, if an amplifier having impedance matched to a transmission line through the matching network is suddenly turned on, and the net capacitance of the amplifier changes with time as seen from a signal at its entry port, this change in net capacitance may be detected by an $S_{11}$ S-parameter sensor and a feedback signal may be constructed to increase either the resistive, capacitive, or inductive elements in the matching circuit, or all, in response to the measured real-time S-parameter.

The approach described above is made possible by a recent advent of high-speed vector network analyzer (VNA) technology that provides measurement rates that can exceed the thermal rise times in active devices. For example, the feedback circuit may include a simple look up table that prescribes a feedback signal in response to the VNA measurement signal, or it may be realized with high-speed modeling computation where the feedback is prescribed in response to a model of the matching network response to the feedback signal. Also, S-parameters may be measured by a real-time VNA and real-time signals fed to the adaptive matching networks to allow them to respond to thermal transients.

The approach also reduces the occurrence of changing S-parameters due to changing active device properties and overcomes changes in matching circuits due to temperature or other effects that vary with time. Also, the approach may drive changes in matching networks used with an amplifier during deployment based on real-time vector measurement of an S-parameter characterization, for example.

FIG. 1A illustrates a system for dynamically adapting a network to an electrical component, such as an amplifier, according to a representative embodiment. For purposes of illustration, the adaptive network is shown separate from the electrical component. However, the present teachings contemplate that the electrical component may be subjected to the feedback signal to achieve the overall performance objectives of the system. Such feedback may be in the form of current of voltage signals. System 100 includes an electrical component 110, an adaptive network 120 connected to one interface (e.g., signal input) of electrical component 110, another adaptive network 130 connected to another interface (e.g., signal output) of electrical component 110, and a feedback device 140 that communicates with each of adaptive networks 120 and 130.

In a representative embodiment of the disclosure, electrical component 110 is a microwave amplifier, such as a gallium-arsenide (GaAs) field-effect transistor (FET). However, electrical component 110 is not limited to being a microwave amplifier. Electrical component 110 may be any type of active electrical component, such as a transistor, amplifier, etc., or any type of passive electrical component, such as a resistor, capacitor, inductor, diode, etc., without departing from the scope of the present teachings. In an embodiment of the disclosure, the microwave amplifier operates in a microwave frequency range of 300 MHz to 300 GHz. However, other embodiments may operate in other ranges of the frequency spectrum.

In a representative embodiment, adaptive network 120 is a network of electrical elements interconnected so as to provide impedance matching between electrical component 110 and a transmission medium from which a microwave signal is received. In other embodiments, adaptive network 120 may match one or more other characteristics of electrical component 110 to a medium providing an input signal.

Adaptive network 120 has at least one electrical characteristic that may be adapted, in response to a feedback signal from feedback device 140. For example, the electrical characteristic may be impedance of adaptive network 120 that is changed by varying a capacitance, inductance, resistance, or attenuation of adaptive network 120 in response to the feedback signal from feedback device 140. Notably, according to the present teachings, various parts of the device characteristic, such as current or voltages, which can be adjusted are considered, as part of the adaptive network and subject to feedback signals. The capacitance, inductance, resistance, or attenuation of adaptive network 120 may be varied by way of one or more of a pin diode, a tuned capacitor, a varactor, or a transmission line tuner.

Adaptive network 120 receives a stimulus from feedback device 140 and provides the stimulus to electrical component 110. The combined response of electrical component 110 and adaptive network 120 to the stimulus is provided to feedback device 140 by adaptive network 120. The adaptive network 120 may couple the stimulus to the transmission medium through a microwave coupler and decouple the response to the stimulus through the microwave coupler.

In a representative embodiment of the disclosure, adaptive network 130 is a network of electrical elements interconnected so as to provide impedance matching between electrical component 110 and a transmission medium to which electrical component 110 conveys a microwave signal. In other embodiments, adaptive network 130 may match one or more other characteristics of electrical component 110 to a medium receiving an output signal from electrical component 110.

Adaptive network 130 has at least one electrical characteristic that may be adapted, in response to a feedback signal from feedback device 140. In an embodiment of the disclosure, the electrical characteristic is an impedance of adaptive network 130 that is changed by varying a capacitance, inductance, resistance or attenuation of adaptive network 130 in response to the feedback signal from feedback device 140. In embodiments of the disclosure, the capacitance, inductance, resistance or attenuation of adaptive network 130 is varied by way of one or more of a pin diode, tuned capacitor, varactor, or length of a transmission line stub.

Adaptive network 130 receives a stimulus from feedback device 140 and provides the stimulus to electrical component 110. The combined response of electrical component 110 and adaptive network 130 to the stimulus is provided to feedback device 140 by adaptive network 130. The adaptive network 130 may couple the stimulus to the transmission medium through a microwave coupler and decouple the response to the stimulus through the microwave coupler, for example.

Generally, feedback device 140 generates the stimuli provided to adaptive networks 120 and 130, receives the responses to the stimuli from adaptive networks 120 and 130, respectively, measures one or more parameters based upon each of the responses, generates the feedback signals provided to adaptive networks 120 and 130, and tracks the performance of system 100 over time. Although feedback device 140 is illustrated as a single device in FIG. 1A, each of adaptive network 120 and adaptive network 130 may communicate with and be controlled by separate feedback devices having similar or identical capabilities to that of feedback device 140.

Figure 1B:
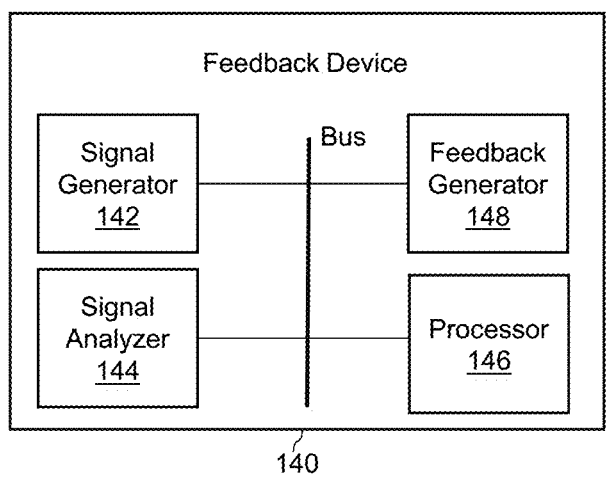
FIG. 1B illustrates features of a feedback device illustrated by FIG. 1A in greater detail, according to a representative embodiment.

FIG. 1B illustrates features of the feedback device illustrated by FIG. 1A in greater detail. Referring to FIG. 1B, feedback device 140 includes one or more signal generators 142 for generating the stimulus provided to each of adaptive networks 120, 130. In an embodiment of the disclosure, signal generator 142 generates microwave signals. However, other embodiments may generate signals of other types and frequency ranges.

Feedback device 140 further includes a signal analyzer 144 for analyzing the responses to the stimuli that are received from adaptive networks 120, 130. In an embodiment of the disclosure, signal analyzer 144 is a VNA that analyzes S-parameters (e.g., $S_{11}$, $S_{12}$, $S_{21}$, and/or $S_{22}$). In other embodiments, signal analyzer 144 analyzes other single or multi-port signal characteristics.

Feedback device 140 includes a processor 146 for processing information generated by signal analyzer 144. In an embodiment of the disclosure, processor 146 may be implemented by a computer processor (e.g., of a personal computer (PC) or dedicated workstation), by a microprocessor, application-specific integrated circuits (ASICs), field-programmable gate arrays (FPGAs), other forms of circuitry configured for this purpose, or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions.

In an embodiment of the disclosure, processor 146 models the response of adaptive network 120, 130 or the combined responses of adaptive network 120, 130 and electrical component 110 to the stimuli so as to determine an appropriate feedback signal for varying one or more characteristics of adaptive network 120, 130 that will improve the performance of system 100. In another embodiment of the disclosure, processor 146 identifies, within a lookup table stored in memory and based upon the responses to the stimuli, an appropriate feedback signal for varying one or more characteristics of adaptive network 120, 130 that will improve the performance of system 100. The model may be based upon information of the network connectivity of circuit elements of adaptive network 120, 130 and electrical element 110 and resistive, capacitive, and/or inductive values of the circuit elements, for example. Alternatively, the model or look-up table may be based upon a response to stimuli applied to a standard network comprising the adaptive network 120, 130 and electrical component 110.

Feedback device 140 includes a feedback generator 148 that generates the feedback signal communicated to adaptive network 120, 130. The feedback signal is of a form appropriate for controlling adaptive network 120, 130 to vary its electrical characteristic. In various representative embodiments, the feedback signal may control a pin diode, a tunable capacitor, or a varactor, or the feedback signal may select a transmission line stub of a particular length. Feedback generator 148 may further include an alternating-current (AC) voltage dither generator that generates an AC voltage dither signal. Such AC voltage dither signal may be combined with a direct-current (DC) voltage signal within the feedback signal to control the electrical characteristic through both a DC voltage component and an AC voltage dither component. In exemplary embodiments, the DC and AC dither components of the feedback signal may control a pin diode, a tunable capacitor, or a varactor, or may adjust the length of a transmission line stub.

Signal generator 142, signal analyzer 144, processor 146, and feedback generator 148 communicate through an internal communication bus.

Figure 2:
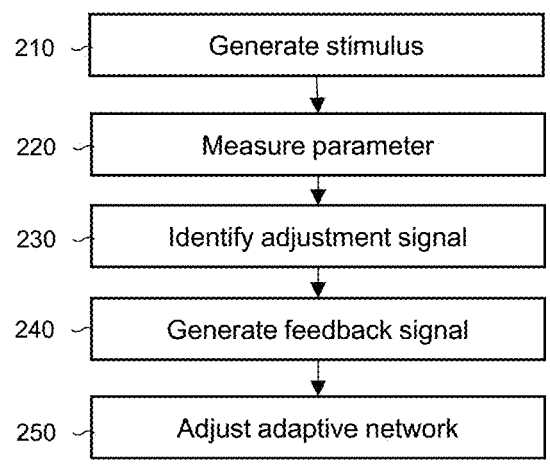
FIG. 2 illustrates a method of operating the system illustrated by FIG. 1A, according to a representative embodiment.

FIG. 2 illustrates a method of operating system 100, according to a representative embodiment. The method may be executed by feedback device 140 under the control of processor 146, for example. According to this method, processor 146 instructs signal generator 142 to generate the stimulus in block 210. The stimulus may be an in-band signal or an out-of-band signal, with respect to a signal that electrical component 110 is intended to modify. For example, the stimulus may be a microwave signal having a sinusoidal frequency close to that of the signal input to electrical component 110 or the signal output by electrical component 110. In response to the instruction, signal generator 142 generates 210 the stimulus and conveys it to one or both of adaptive networks 120, 130.

Signal analyzer 144 receives and measures a parameter of the response to the stimulus in block 220. In embodiments of the disclosure, signal analyzer 144 measures an $S_{11}$ S-parameter of the response received from adaptive network 120, an $S_{22}$ S-parameter of the response received from adaptive network 130, or both. Signal analyzer 144 communicates the parameter measurement to processor 146.

Processor 146 identifies an appropriate adjustment signal in block 230 for adjusting one or each of adaptive networks 120, 130 so as to obtain one or more desired outcomes with respect to electrical component 110. In an embodiment of the disclosure, processor 146 models the behavior of electrical component 110 and one or each of adaptive networks 120, 130 so as to determine or identify appropriate adjustment signal(s) in block 230 based on the parameter measurement(s). In another embodiment, processor 146 uses each parameter measurement as an index value within a look-up table corresponding to adaptive network 120 or a look-up table corresponding to adaptive network 130 to identify an adjustment signal corresponding to the index value. Processor 146 may identify an adjustment signal that is expected to reduce the difference between an expected or ideal response to the applied stimulus and the actual response to the stimulus, as determined from the measurement parameter. Processor 146 communicates an indicator of each identified adjustment signal to feedback generator 148.

Feedback generator 148 receives the indicator(s) of the identified adjustment signal(s) and generates a feedback signal corresponding to each identified adjustment signal in block 240. For a feedback signal generated for adaptive network 120, feedback generator 148 conveys the feedback signal to adaptive network 120. For a feedback signal generated for adaptive network 130, feedback generator 148 conveys the feedback signal to adaptive network 130. The feedback signal may include both a DC component and an AC dithering component, for example.

Each of adaptive networks 120, 130 adjusts an electrical characteristic (e.g., impedance) of the respective adaptive network 120, 130 in block 250 in accordance with the received feedback signal. In an embodiment of the disclosure, the feedback signal is provided to a pin diode, a tunable capacitor, or a varactor to vary the impedance of adaptive network 120, 130. In another embodiment, the feedback signal controls which of various-length transmission line stubs are electrically connected to electrical component 110 or the effective length of a transmission line stub electrically connected to electrical component 110. In various embodiments of the disclosure, the feedback signal changes one or more of inductance, capacitance, resistance or attenuation to adjust the electrical characteristic of the adaptive network 120, 130.

Figure 3:
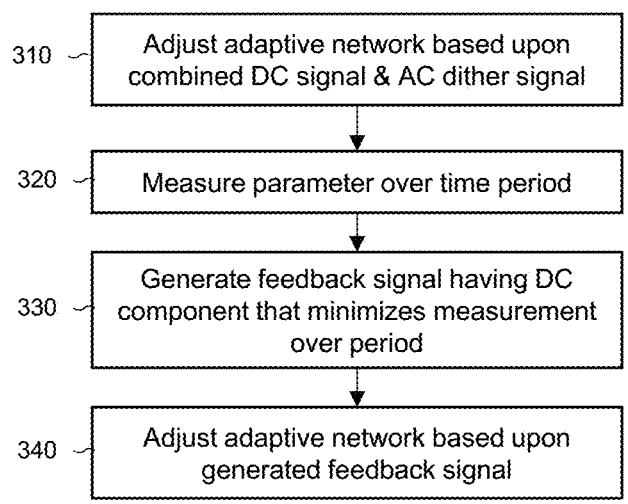
FIG. 3 illustrates another method of operating the system illustrated by FIG. 1A in which both a DC and an AC signal are applied to the adaptive network, according to a representative embodiment.

FIG. 3 illustrates another method of operating system 100, according to a representative embodiment. According to this method, processor 146 controls feedback generator 148 to generate a feedback signal comprising both a DC component and an AC dither component. The DC component is selected to bring the electrical characteristic of adaptive network 120, 130 to a desired operating point. The AC dither component is selected to vary the electrical characteristic slightly about the operating point. An appropriate feedback signal may be selected in accordance with the method described in relation to FIG. 2.

In an embodiment of the disclosure, the electrical characteristic is an impedance of adaptive network 120, 130. The DC component of the feedback signal establishes an operating point for the impedance, and the AC dither component varies the impedance about the operating point. The impedance may be varied, for example, in response to changes in inductance, capacitance, resistance or attenuation of adaptive network 120, 130.

Feedback generator 148 conveys the generated feedback signal to adaptive network 120, 130. Adaptive network 120, 130 adjusts the electrical characteristic in accordance with the received feedback signal in block 310. More specifically, adaptive network 120, 130 sets the operating point of the electrical characteristic and dithers the electrical characteristic about the operating point based upon the feedback signal.

Processor 146 controls signal generator 142 to provide a stimulus to adaptive network 120, 130, as described in connection with the method illustrated by FIG. 2. Signal analyzer 144 measures a parameter of a response to the stimulus over a period of time and communicates the measurements to processor 146 in block 320. Based upon the measurements, processor 146 dynamically identifies a DC component of an adjustment signal that is expected to minimize the value of the measured parameter over the period of time. Processor 146 controls feedback generator 148 in block 330 to generate a feedback signal comprising the identified DC component. Feedback generator 148 conveys the feedback signal to adaptive network 120, 130, and adaptive network 120, 130 adjusts the operating point of the electrical characteristic in block 340 in accordance with the DC component of the feedback signal. In an exemplary embodiment, the measured parameter is an $S_{11}$ or $S_{22}$ S-parameter.

Figure 4A:
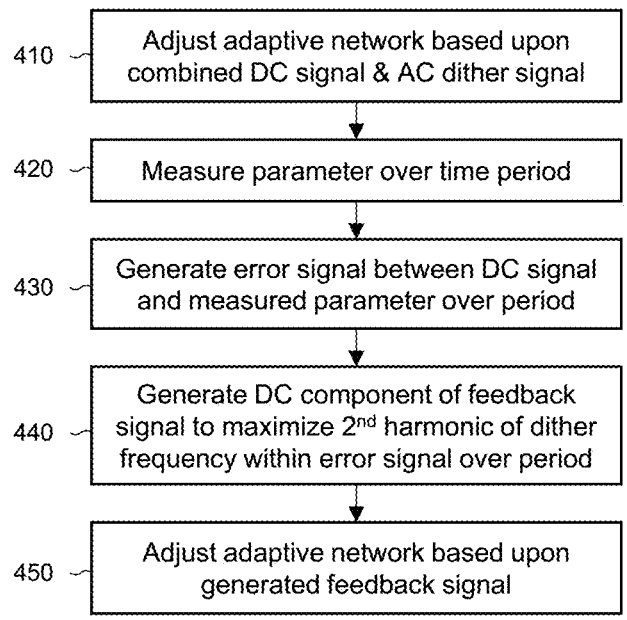
FIG. 4A illustrates still another method of operating the system illustrated by FIG. 1A in which an error signal is used to generate a signal for adjusting the adaptive network, according to a representative embodiment.

FIG. 4A illustrates another method of operating system 100, according to a representative embodiment. According to this method, processor 146 controls feedback generator 148 to generate a feedback signal comprising both a DC component and an AC dither component, as described in connection with FIG. 3. Feedback generator 148 conveys the generated feedback signal to adaptive network 120, 130. Adaptive network 120, 130 adjusts the electrical characteristic in accordance with the received feedback signal in block 410. More specifically, adaptive network 120, 130 sets the operating point of the electrical characteristic and dithers the electrical characteristic about the operating point based upon the feedback signal.

Processor 146 controls signal generator 142 to provide a stimulus to adaptive network 120, 130, as described in connection with the method illustrated by FIG. 2. Signal analyzer 144 measures a parameter of a response to the stimulus in block 420 over a period of time and communicates the measurements to processor 146.

Processor 146 generates an error signal between the DC component of the feedback signal and the measured parameter in block 430. Such error signal may be generated by subtracting the value of the measured parameter from the value of the feedback signal's DC component or vice versa. In an alternative embodiment, a summer generates the error signal and conveys it to processor 146. In an embodiment of the disclosure, the measured parameter is an $S_{11}$ or $S_{22}$ S-parameter.

Based upon the generated error signal, processor 146 dynamically identifies a DC component of an adjustment signal that is expected to maximize the second harmonic of the dither frequency within the error signal over the period of time. Processor 146 controls feedback generator 148 to generate a feedback signal in block 440 comprising the identified DC component. Feedback generator 148 conveys the feedback signal to adaptive network 120, 130. Adaptive network 120, 130 adjusts 450 the operating point of the electrical characteristic in accordance with the DC component of the feedback signal.

Figure 4B:
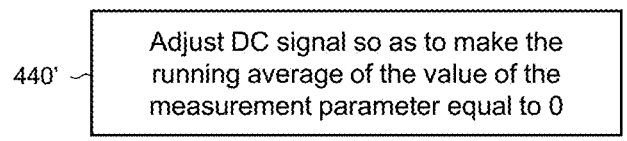
FIG. 4B illustrates a variation of the method illustrated by FIG. 4 in which a running average of a measurement parameter value is used to generate a signal for adjusting the adaptive network, according to a representative embodiment.

FIG. 4B illustrates a variation of the method illustrated by FIG. 4A. According to this variation, processor 146 substitutes the operation shown in block 440' for the operations shown in blocks 430 and 440 within the method illustrated by FIG. 4A. More specifically, processor 146 dynamically identifies a DC component of an adjustment signal that is expected to make the running average of the value of the measured parameter equal to zero within the period of time. In an embodiment of the disclosure, the measured parameter is an $S_{11}$ or $S_{22}$ S-parameter. Processor 146 controls feedback generator 148 to generate a feedback signal in block 440' comprising the identified DC component. Feedback generator 148 conveys the feedback signal to adaptive network 120, 130. Adaptive network 120, 130 adjusts the operating point of the electrical characteristic in accordance with the DC component of the feedback signal in block 450.

Figure 4C:
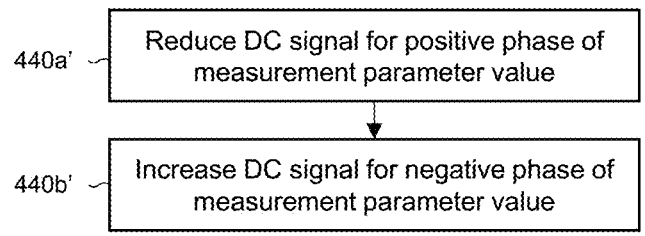
FIG. 4C illustrates another variation of the method illustrated by FIG. 4 in which a phase of a measurement parameter value is used to generate a signal for adjusting the adaptive network.

FIG. 4C illustrates another variation of the method illustrated by FIG. 4A. According to this variation, processor 146 substitutes operations shown in blocks 440a' and 440b' for operations shown in blocks 430 and 440 within the method illustrated by FIG. 4A. More specifically, processor 146 dynamically reduces a DC component of an adjustment signal in block 440a' when the measured parameter has a positive phase and increases the DC component of the adjustment signal in block 440b' when the measured parameter has a negative phase. In an embodiment of the disclosure, the measured parameter is an $S_{11}$ or $S_{22}$ S-parameter. Processor 146 controls feedback generator 148 to generate a feedback signal in block 440' comprising the identified DC component. Feedback generator 148 conveys the feedback signal to adaptive network 120, 130. Adaptive network 120, 130 adjusts the operating point of the electrical characteristic in accordance with the DC component of the feedback signal in block 450.

Figure 4D:
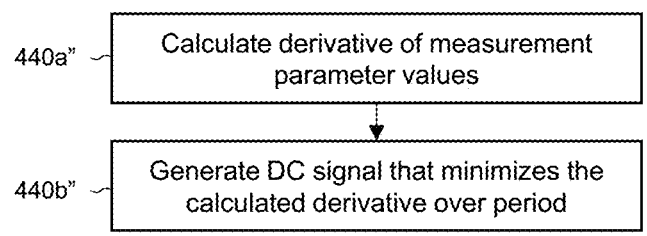
FIG. 4D illustrates still another variation of the method illustrated by FIG. 4 in which a derivative of a measurement parameter value is used to generate a signal for adjusting the adaptive network, according to a representative embodiment.

FIG. 4D illustrates another variation of the method illustrated by FIG. 4A. According to this variation, processor 146 substitutes operations shown in blocks 440a" and 440b" for operations shown in blocks 430 and 440 within the method illustrated by FIG. 4A. More specifically, processor 146 calculates the derivative of the value of the measured parameter over time in block 440a". Based upon the calculated derivative, processor 146 dynamically identifies a DC component of an adjustment signal that is expected to minimize the calculated derivative over the period of time. In an embodiment of the disclosure, the measured parameter is an $S_{11}$ or $S_{22}$ S-parameter. Processor 146 controls feedback generator 148 to generate a feedback signal comprising the identified DC component in block 440b". Feedback generator 148 conveys the feedback signal to adaptive network 120, 130. Adaptive network 120, 130 adjusts the operating point of the electrical characteristic in accordance with the DC component of the feedback signal in block 450.

Figure 5:
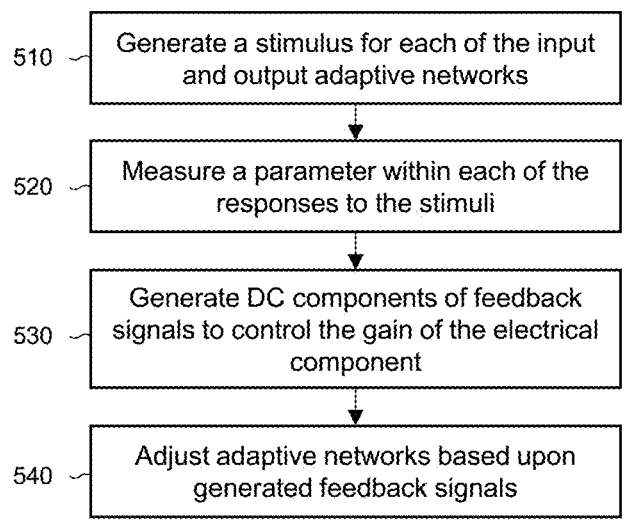
FIG. 5 illustrates yet another method of operating the system illustrated by FIG. 1A so as to control the gain achieved by the system, according to a representative embodiment.

FIG. 5 illustrates another method of operating system 100. According to this method, processor 146 controls signal generator 142 to generate first and second stimuli in block 510. The first stimulus is conveyed to adaptive network 120, and the second stimulus is conveyed to adaptive network 130.

Signal analyzer 144 receives a first response to the first stimulus from adaptive network 120 and a second response to the second stimulus from adaptive network 130. In block 520, signal analyzer 144 measures a first parameter within the first response and measures a second parameter within the second response. Signal analyzer 144 conveys the first and second parameter measurements to processor 146.

Processor 146 identifies first and second DC components of first and second feedback signals, respectively, that are expected to produce a particular gain by the electrical component 110 when such first and second feedback signals are applied to adaptive network 120 and adaptive network 130, respectively. In an embodiment of the disclosure, electrical component 110 is an amplifier, for example. Processor 146 controls feedback generator 148 to generate the first and second feedback signals having the identified first and second DC components, respectively, in block 530. Feedback generator 148 conveys the first feedback signal to adaptive network 120 and conveys the second feedback signal to adaptive network 130.

In block 540, adaptive network 120 adjusts the electrical characteristic of adaptive network 120 in accordance with the DC component of the first feedback signal. Similarly, adaptive network 130 adjusts the electrical characteristic of adaptive network 130 in accordance with the DC component of the second feedback signal.

In the various embodiments of the disclosure, the methods illustrated by FIGS. 2-5 are executed within a period of about one millisecond or less. Also, in an embodiment of the disclosure, the stimulus applied to electrical component 110 and adaptive network 120, 130 is a microwave signal. In a representative embodiment, the frequency of the microwave signal is between about 0.1 GHz and 100 GHz, for example.

Figure 6:
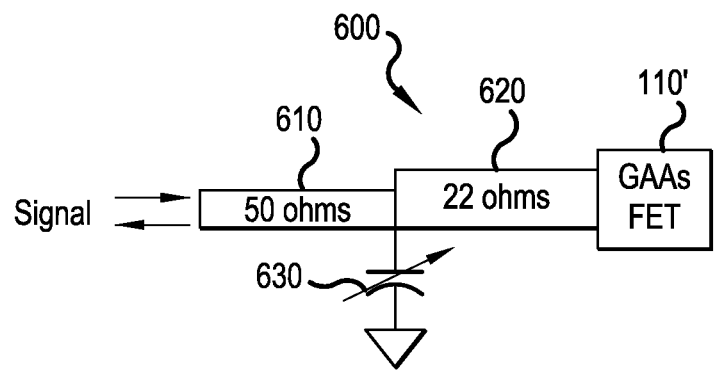
FIG. 6 illustrates an electrical system having an adaptive network, according to a representative embodiment.

FIG. 6 illustrates an electrical system having an adaptive network, according to a representative embodiment. Electrical system 600 includes a transmission line 620, an active device 110', and an adaptive element 630. Electrical system 600 has electromagnetic signal communication with signal transmission medium 610. Transmission line 620 and adaptive element 630 constitute an adaptive network, such as adaptive network 120 illustrated in FIG. 1. Amplifier 110' is a representative embodiment of electrical component 110, illustrated in FIG. 1. For purposes of illustration, active device 110' is a GaAs FET with an operational frequency of 7 GHz. Signal transmission medium 610 is a medium by which a 7 GHz microwave signal is received and has an impedance of 50 Ohms.

Figure 7:
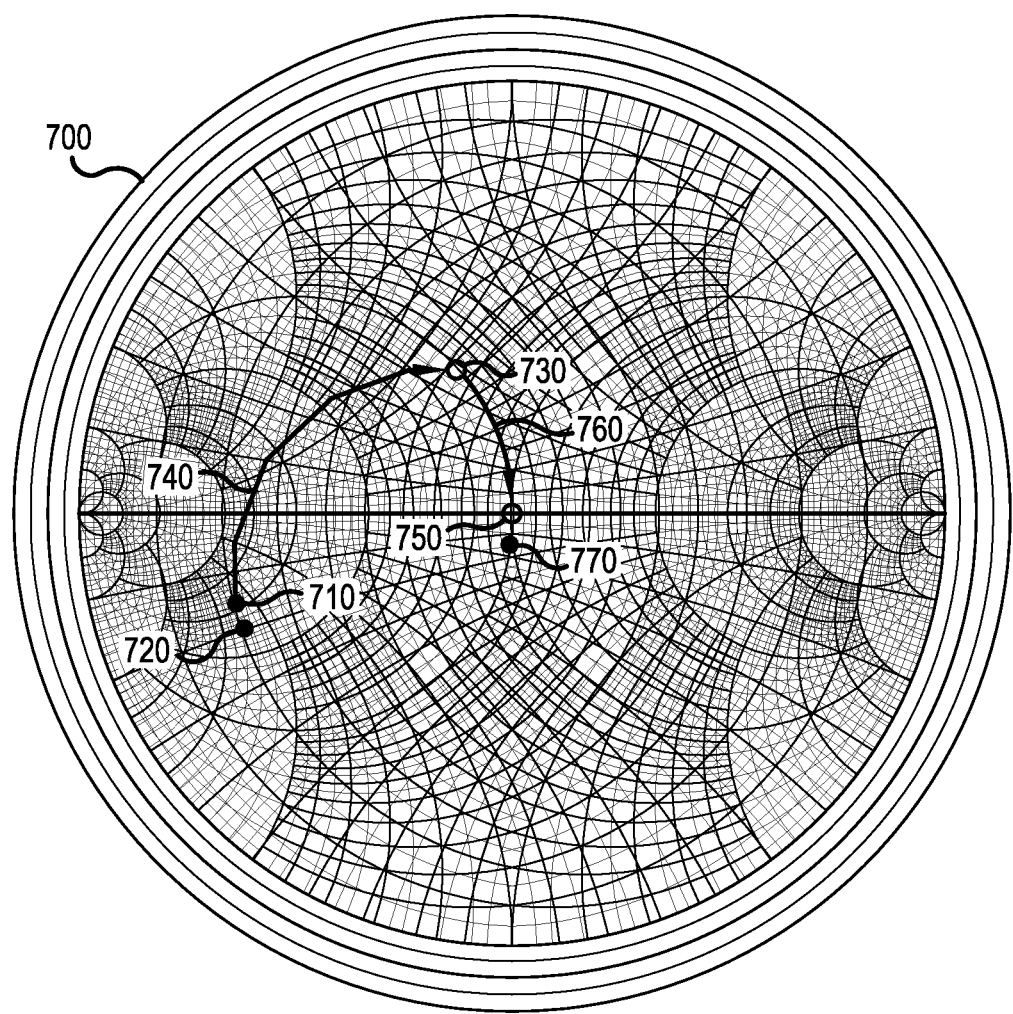
FIG. 7 illustrates a Smith Chart applied in choosing parameter values for the electrical system illustrated by FIG. 6, according to a representative embodiment.

FIG. 7 illustrates a Smith Chart indicating parameter values for electrical system 600 illustrated by FIG. 6, according to a representative embodiment. Smith Chart 700 illustrates impedances of active device 110' by S-parameters, indicated by complex impedances 710, 720, 730, 750 and 770. Impedance 750 indicates the matching point (e.g., 50 Ohms) of the active device 110' with the signal transmission medium 610. Impedance 720 indicates an initial unadjusted complex impedance of the active device 110'. As discussed above, operating characteristics of the active device 110', such as capacitance in the present example, may shift during operation for various reasons, such as temperature variations.

In the example of FIG. 7, it is assumed that the capacitance of the active device 110' changes by 20 percent. This results in a shift from impedance 720 to impedance 710, as well as a corresponding shift in matched impedance of the active device 110' from impedance 750 to impedance 770. To achieve the maximal performance from electrical system 600, adaptive network 120 is configured to optimally match the impedance of the active device 110' to that of the signal transmission medium 610 at impedance 750, in response to the 20 percent change in capacitance of the active device 110'.

Referring to FIG. 7, the 22 Ohm transmission line 620 in electromagnetic communication with active device 110' causes the combined impedance to transition along trace 740 from impedance 710 of active device 110' to the combined impedance 730 of active device 110' and transmission line 620. A capacitance value is selected through feedback to the adaptive network and applied via adaptive element 630 for transitioning along trace 760 from the combined impedance 730 of active device 110' and transmission line 620 to the 50 Ohm impedance 750 to provide matching between the active device 110' and the transmission medium 610. In this representative example, adaptive element 630 is a varactor having this selected capacitance as its nominal value. Thus, the combined impedance of active device 110', transmission line 620, and adaptive element 630 becomes the same as that of the signal transmission medium 610 (i.e., 50 Ohms).

In operational use, electrical system 600 may develop an impedance that differs from 50 Ohms due to the components of electrical system 600 aging, temperature variations as active device 110' is turned on and off, environmental temperature variations, etc., that cause changes to operating characteristics of the active device 110' (such as the 20 percent change in capacitance, discussed above. For example, impedance 770 may indicate an impedance presented by electrical system 600 to signal transmission medium 610 due to a change in device capacitance, resulting from temperature change effects as electrical system 600 is being employed by an end user. Impedance 720 indicates the impedance presented by active device 110' in the absence of device capacitance changes caused by temperature change in the active device 110'. Impedance 710 corresponds to an impedance change of the active device 110' due to the temperature change resulting into a net impedance mismatch, the impedance mismatch itself being indicated by the difference between impedance 770 and impedance 750. The change of impedance 770 from the optimal value of 50 Ohms reduces the performance of electrical system 600. Accordingly, adaptively varying the impedance presented by electrical system 600 during its operational use is desirable to increase system performance.

Figure 8:
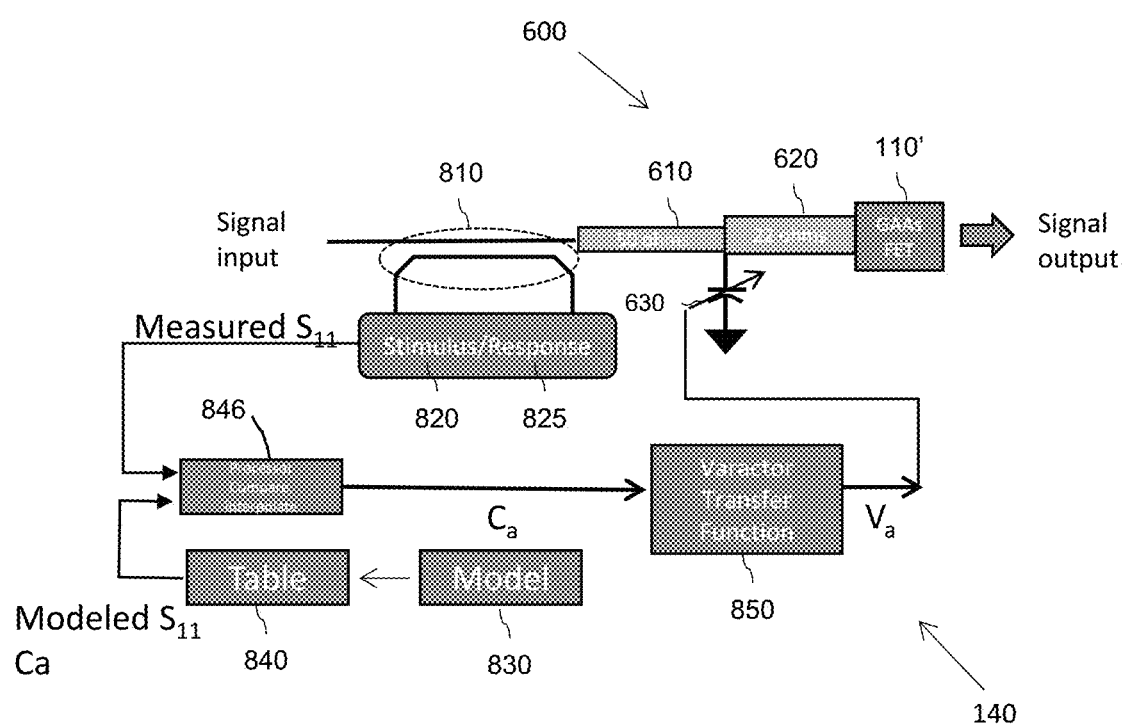
FIG. 8 illustrates a simplified block diagram of a feedback system for dynamically adapting impedance of the electrical system illustrated by FIG. 6, according to a representative embodiment.

FIG. 8 illustrates a simplified block diagram of a feedback system for dynamically adapting impedance of the electrical system illustrated by FIG. 6, according to a representative embodiment. Referring to FIG. 8, a microwave coupler 810 couples a stimulus signal 820 to signal transmission medium 610 so that stimulus signal 820 is received by electrical system 600 through signal transmission medium 610. Stimulus signal 820 may be a low-amplitude background signal, an out-of-band signal, and/or a signal transmitted through system control, for example, so as not to interfere with the signal intended to be amplified by active device 110', or a signal that is actively cancelled from the output signal of active device 110'. A stimulus signal 820 having a low amplitude relative to the signal input may be effectively attenuated down-circuit of electrical system 600 so as not to create interference with the signal input intended to be amplified by active device 110'. Such low-amplitude background signal may be an in-band or out-of-band signal with respect to the signal input intended to be amplified by active device 110'. Alternatively, an out-of-band stimulus signal 820 may be effectively attenuated down-circuit of electrical system 600 by a band-pass filter so as not to create interference with the signal input intended to be amplified by active device 110'. As another alternative, stimulus signal 820 may time share signal transmission medium 610 so that only one of stimulus signal 820 and the signal input intended to be amplified by active device 110' is presented on signal transmission medium 610 at a given time. As yet another alternative, stimulus signal 820 may be actively cancelled down-circuit of electrical system 600 by summing it (i.e., its downstream version) with an inverted (i.e., 180-degree out of phase) version of itself, so as not to create downstream interference with the signal input intended to be amplified by active device 110'.

A portion of stimulus signal 820 is reflected by electrical system 600 and is coupled into feedback device 140 through microwave coupler 810 as a response signal 825, which in the example is S-parameter $S_{11}$. In the depicted embodiment, feedback device 140 includes model 830, look-up table 840, processor 846, and varactor transfer function 850. Model 830 is configured to model the electrical system 600 and the matching circuit in order to compute predetermined S-parameter $S_{11}$ data for a range of active element capacitance values, for example, that depend on active element 110' temperature and/or other environmental/operational factors. Table 840 is populated by the modeling results calculated of model 830, such that table 840 comprises an array of computed $S_{11}$ data derived for the various capacitance values (e.g., C1, C2 . . . Cn).

The measured S-parameter $S_{11}$ provided by the response signal 825 is compared to the modeled S-parameters $S_{11}$ from table 840 by processor 846. This enables one-to-one matching between the measured S-parameter $S_{11}$ and an active element capacitance Ca in the table 840, thus allowing determination of a variation of the active element capacitance $C_a$ within adaptive element 630 that will return the impedance presented by electrical system 600 to the desired impedance of 50 Ohms. The active element capacitance Ca determined by the processor 846 is provided to the varactor transfer function 850, which identifies a voltage $V_a$ to be applied to adaptive element 630 (i.e., the varactor) to achieve the identified capacitance variation $C_a$. Feedback system 140 applies the identified voltage $V_a$ to adaptive element 630 (i.e., the varactor) and thereby returns electrical system 600 to a state in which it presents the desired impedance of 50 Ohms to signal transmission medium 610. It is envisioned that circuit design objectives may be to achieve impedance targets other than 50 Ohms, such as a desired complex impedance located elsewhere on Smith Chart 700, for example. These alternate impedance targets may be achieved in accordance with the processes described in this disclosure, as would be apparent to one of ordinary skill in the art.

The above-described process may be conducted repeatedly in real time or near real time so as to keep the actual impedance presented by electrical system 600 at or near its desired impedance continually.

Table 1, below, provides representative relationships among S-parameters $S_{11}$, impedance $Z_a$, capacitance variation $C_a$, and a model capacitance change Cn due to an undesired variation of the impedance within the electrical system 600 illustrated by FIG. 6. For example, the S-parameter $S_{11}$ data in the second column of Table 1 is computed using a model of the active device 110' (e.g., model 830) and the matching circuit (e.g. transmission line 620, adaptive element 630) for a range of active element capacitance values in the first column that depend, for example, on active element temperature. As stated above, the measured S-parameter $S_{11}$ is compared to the array of S-parameters $S_{11}$ in the second column of Table 1, calculated from the model 830 for various values of capacitance active elements C1, C2 . . . Cn, by the processor 846. This permits a one-to-one matching between the measured S-parameter $S_{11}$ of FIG. 8 and an active element capacitance in the first column of Table 1 allowing determination of variance in the active element capacitance. Interpolation techniques may be used by the processor 846 to compensate for the discrete nature of the lookup table.

The third column of Table 1 is the corresponding modeled match impedance for various active element capacitances. $C_{a1 \ldots N}$ in the fourth column of Table 1 is the required adaptive matching element capacitance array value computed by the model corresponding to the array of active element capacitances in the first column of Table 1 indicating the necessary adjustment capacitance of the adaptive element 630. Therefore the measured S-parameter $S_{11}$ in FIG. 8 has a corresponding adaptive capacitance value, $C_a$ in the fourth column of Table 1 as determined by the processor 846 to obtain the target match of 50 Ohms. The value $C_a$ requested of adaptive element 630 in FIG. 8 corresponds to a specific applied voltage, $V_a$, via the varactor transfer function 850.

More particularly, measured S-parameter $S_{11}$ is compared to modeled S-parameter $S_{11}$ allowing a determination of the capacitance change in the active element yielding a complex impedance Za. For example, an S-parameter $S_{11}$ value of 0.103, 92.19 degrees corresponds to an impedance for electrical system 600 of 48.561+j10.152, a model capacitance change of 2.212 pf and an adjustment capacitance of 0.445 pf for bringing the impedance of electrical system 600 back to the desired impedance of 50 Ohms. An S-parameter $S_{11}$ value of 0.003, 2.01 degrees corresponds to an impedance for electrical system 600 of 50.341+j0.012, a model capacitance change of 2.765 pf and an adjustment capacitance of 0.351 pf for bringing the impedance of electrical system 600 back to the desired impedance of 50 Ohms. And, a S-parameter $S_{11}$ value of 0.069, −93.01 degrees corresponds to an impedance for electrical system 600 of 49.173+ j6.799, a model capacitance change of 3.318 pf and an adjustment capacitance of 0.2885 pf for bringing the impedance of electrical system 600 back to the desired impedance of 50 Ohms.

TABLE 1

| Variation in modeVI capacitance | Calculated S11 from Za | Model given Za | Calculated GaAs FET capacitance change |
|---|---|---|---|
| C1 = 2.212 pf | 0.103, 92.19 deg | 48.561 + j10.152 | $C_{a1}$ = 0.445 pf |
| C2 = 2.765 pf | 0.003, 2.01 deg | 50.341 + j0.012 | $C_{a2}$ = 0.351 pf |
| C3 = 3.318 pf | 0.069, −93.01 deg | 49.173 − j6.799 | $C_{a3}$ = 0.2885 pf |

Figure 9:
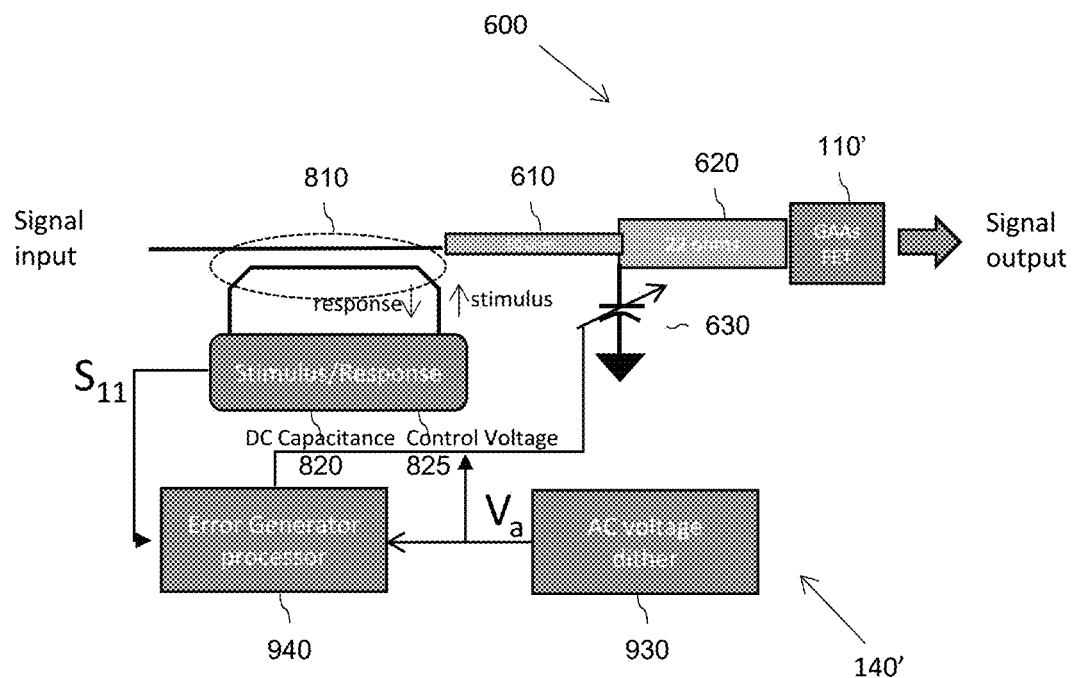
FIG. 9 illustrates a simplified block diagram of a feedback system for dynamically adapting impedance of the electrical system illustrated by FIG. 6, according to another representative embodiment.

FIG. 9 illustrates a simplified block diagram of a feedback system for dynamically adapting impedance of the electrical system illustrated by FIG. 6, according to another representative embodiment (an example of which is discussed above with reference to FIG. 4A). Referring to FIG. 9, the microwave coupler 810 couples the stimulus signal 820 and the corresponding response signal 825 to signal transmission medium 610, as discussed above. That is, a portion of the stimulus signal 820 is reflected by electrical system 600 and is coupled into feedback device 140' through microwave coupler 810 as the response signal 825, which in the example is S-parameter S11.

In the depicted embodiment, feedback device 140' includes AC voltage dither generator 930 and error generator processor 940. The AC voltage dither generator 930 is configured to generate an AC voltage dither signal, which is selected to vary the electrical characteristic slightly about an operating point. The AC voltage dither generator 930 includes an analog-to-digital converter (ADC) (not shown) for providing a voltage Va as an AC component of the voltage Va as feedback applied to adaptive element 630 (i.e., the varactor). The voltage Va is also provided to the error generator processor 940.

The error generator processor 940 receives S-parameter $S_{11}$ from the response signal 825, as well as the voltage Va from the AC voltage dither generator 930, and records the magnitude of the S-parameter $S_{11}$ and the voltage Va as pairs. The magnitude of the S-parameter $S_{11}$ is indicated by the absolute value of $S_{11}$ ($|S_{11}|$). More particularly, referring to FIG. 10, for example, the error generator processor 940 maps out the absolute values of $S_{11}$ to determine a $|S_{11}|$ curve, indicated by trace 1010 as a function of DC voltage. The error generator processor 940 then sets a DC component of the voltage Va to the minimum magnitude of the S-parameter $S_{11}$, indicated by reference 1011. The DC and AC components of the voltage Va control the adaptive element 630 to achieve a capacitance variation Ca that returns electrical system 600 to a state in which it presents the desired impedance of 50 Ohms to signal transmission medium 610. Accordingly, a dither control loop is used to set the voltage Va for controlling the adaptive element 630.

Figure 10:
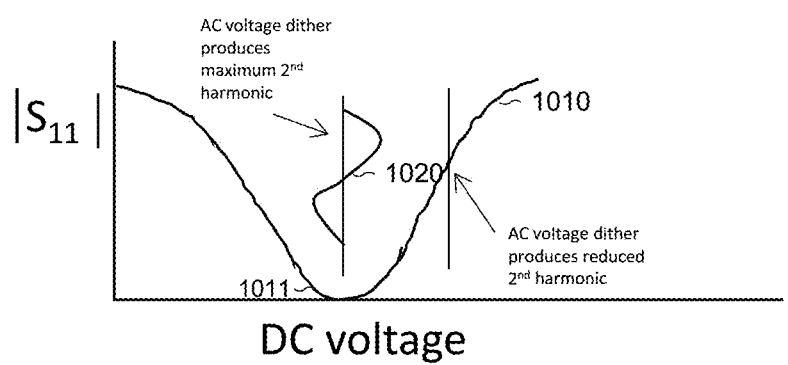
FIG. 10 illustrates a graph of magnitude of the S-parameter $S_{11}$ as a function of DC voltage, provided by error generator processor of FIG. 9, according to a representative embodiment.

In addition, the error generator processor 940 maximizes the second harmonic of the AC dither frequency, indicated by trace 1020 in FIG. 10, since the magnitude of S-parameter $S_{11}$ is approximately a symmetric function about the minimum magnitude 1011. The linear part gives a fundamental response in phase with the magnitude of S-parameter $S_{11}$. For example, when the phase is positive, the DC voltage component is lowered. The additional vertical line in FIG. 10 depicts an example or an operating point indicating a reduced second harmonic produced by AC voltage dither.

In another embodiment, sharing the same configuration as shown in FIG. 9 (an example of which is discussed above with reference to FIGS. 4B and 4C), the AC voltage dither generator 930 provides a voltage Va as the AC component of the voltage Va to the 630, as discussed above. However, the error generator processor 940 is configured to set the DC component of the voltage Va such that a running average of the argument of the S-parameter $S_{11}$ is zero. The running average of the argument of the S-parameter $S_{11}$ may be computed numerically by the error generator processor 940. Accordingly, phase of S-parameter $S_{11}$ is used to set the voltage Va for controlling the adaptive element 630.

Figure 11:
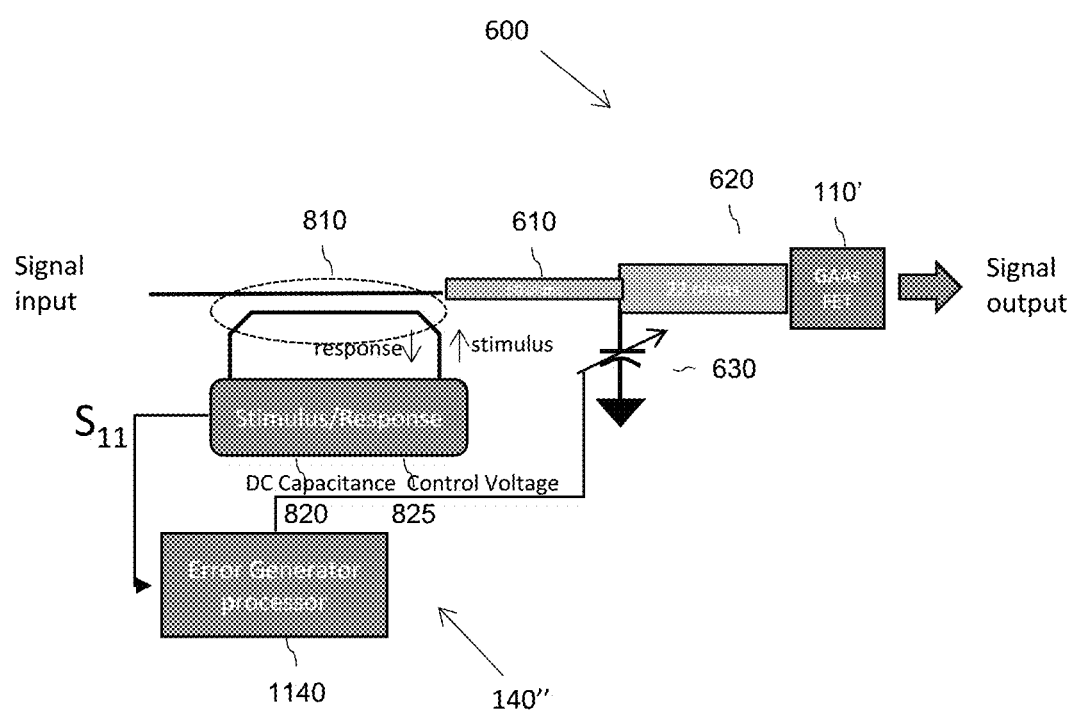
FIG. 11 illustrates a simplified block diagram of a feedback system for dynamically adapting impedance of the electrical system illustrated by FIG. 6, according to another representative embodiment.

FIG. 11 illustrates a simplified block diagram of a feedback system for dynamically adapting impedance of the electrical system illustrated by FIG. 6, according to another representative embodiment. Referring to FIG. 11, the microwave coupler 810 couples the stimulus signal 820 and the corresponding response signal 825 to signal transmission medium 610, as discussed above. That is, a portion of the stimulus signal 820 is reflected by electrical system 600 and is coupled into feedback device 140" through microwave coupler 810 as the response signal 825, which in the example is S-parameter $S_{11}$.

In the depicted embodiment, feedback device 140" includes AC error generator processor 1140, which receives S-parameter $S_{11}$ from the response signal 825. Unlike the embodiment depicted in FIG. 9, there is no the AC voltage dither generator to provide an AC component to the error generator processor 1140. Rather, the error generator processor 1140 is configured to record the magnitude of the S-parameter $S_{11}$ ($|S_{11}|$), and compare the recorded magnitude with a predetermined tolerance. When the magnitude of the S-parameter $S_{11}$ exceeds the predetermined tolerance, the error generator processor 1140 begins a global search, sampling various values of voltage Va, receiving data from the response signal 825, and computing derivatives of the magnitude of the S-parameter $S_{11}$ versus voltage to ultimately find the global minimum. Once determined, the global minimum is applied to the adaptive element 630 as the voltage Va in order to achieve a capacitance variation Ca that returns electrical system 600 to a state in which it presents the desired impedance of 50 Ohms to signal transmission medium 610. Accordingly, a global search method is used to set the voltage Va for controlling the adaptive element 630.

Notably, in various embodiments discussed above with reference to FIGS. 8-11, processing units may be incorporated for performing the associated functionalities. For example, model 830, table 840, processor 846, varactor transfer function 850, error generator processor 940 and/or error generator processor 1140 may be implemented, at least in part, by a computer processor (e.g., of a personal computer (PC) or dedicated workstation), by a microprocessor, ASICs, FPGAs, other forms of circuitry configured for this purpose, or combinations thereof, using software, firmware, hard-wired logic circuits, or combinations thereof. A computer processor, in particular, may be constructed of any combination of hardware, firmware or software architectures, and may include memory (e.g., volatile and/or non-volatile memory) for storing executable software/firmware executable code that allows it to perform the various functions.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:
1. A system for impedance matching at least an electrical component configured to modify an input electromagnetic signal, the system comprising:
an adaptive network electrically cooperating with the electrical component, the adaptive network comprising at least one tunable electrical element for dynamically adjusting impedance of the adaptive network; and
a feedback device configured to provide a stimulus signal to the adaptive network through a microwave coupler, the feedback device comprising:
a measurement device configured to measure a scattering parameter of a combined response by the electrical component and the adaptive network to the stimulus signal received through the microwave coupler, the stimulus signal not interfering with the input electromagnetic signal;
a processor configured to match the measured scattering parameter with a predetermined parameter, and to identify a feedback signal corresponding to the predetermined parameter; and
a feedback generator configured to generate the feedback signal and to convey the generated feedback signal to the adaptive network for controlling the at least one tunable electrical element to dynamically adjust the impedance of the adaptive network in response to the feedback signal to match a desired impedance for the electrical component.

2. The system of claim 1, wherein:
the feedback signal comprises a direct current (DC) voltage combined with an alternating current (AC) dither voltage,
the scattering parameter is a reflection scattering parameter,
the measurement device measures the reflection scattering parameter over a period of time,
the processor generates an error signal of errors between DC voltages of multiple feedback signals generated over the period of time and magnitudes of measured values of the reflection scattering parameter over the period of time,
the processor identifies, over the period of time, the multiple feedback signals having the respective DC voltages so as to maximize a second harmonic of a dither frequency within the error signal, and
the feedback generator generates the identified feedback signals and conveys the generated feedback signals to the adaptive network.

3. The system of claim 2, wherein the processor reduces the DC voltage within the corresponding identified feedback signal when the reflection scattering parameter has a positive phase and increases the DC voltage within the corresponding identified feedback signal when the reflection scattering parameter has a negative phase.

4. The system of claim 1, wherein:
the at least one tunable electrical element comprises one of a pin diode, a tunable capacitor, or a varactor, and
the feedback signal received by the adaptive network is applied to the one of the pin diode, the tunable capacitor, or the varactor for adjusting the impedance.

5. The system of claim 1, wherein:
the at least one tunable electrical element comprises a variable-length transmission line tuner, and
the feedback signal received by the adaptive network is applied to change a length of the transmission line tuner for adjusting the impedance.

6. The system of claim 1, further comprising:
another adaptive network electrically cooperating with the electrical component, the another adaptive network comprising another tunable electrical element for dynamically adjusting impedance of the another adaptive network,
wherein the feedback device is further configured to provide another stimulus signal to the another adaptive network through another microwave coupler, the feedback device further comprising another measurement device configured to measure another scattering parameter indicative of a combined response by the electrical component and the another adaptive network to the another stimulus signal received through the another microwave coupler,
wherein the processor is further configured to match the another measured scattering parameter with another predetermined parameter, and to identify another feedback signal corresponding to the another predetermined parameter, and
wherein the feedback generator is further configured to generate the another feedback signal and to convey the generated another feedback signal to the another adaptive network for controlling the another tunable electrical element to dynamically adjust the impedance of the another adaptive network in response to the another feedback signal.

7. The system of claim 1, wherein a time period for the feedback generator to generate the feedback signal and the adaptive network to adjust the impedance is less than about one millisecond.

8. The system of claim 1, wherein the processor models the adaptive network based upon the measured scattering parameter so as to identify the feedback signal that reduces the difference between the measured scattering parameter and the predetermined parameter.

9. The system of claim 1, wherein the processor identifies, within a lookup table and based upon the measured scattering parameter, the feedback signal corresponding to the predetermined parameter.

10. The system of claim 1, wherein:
the feedback signal comprises a direct current (DC) voltage combined with an alternating current (AC) dither voltage,
the scattering parameter is a reflection scattering parameter,
the measurement device measures the reflection scattering parameter over a period of time,
the processor identifies, over the period of time, multiple feedback signals having respective DC voltages that minimize measured magnitudes of the reflection scattering parameter over the period of time, and
the feedback generator generates the identified feedback signals and conveys the generated feedback signals to the adaptive network.

11. The system of claim 1, wherein:
the feedback signal comprises a direct current (DC) voltage combined with an alternating current (AC) dither voltage,
the scattering parameter is a reflection scattering parameter,
the measurement device measures the reflection scattering parameter over a period of time,
the processor identifies, over the period of time, multiple feedback signals having respective DC voltages that achieve a running average value of zero for the reflection scattering parameter over the period of time, and
the feedback generator generates the identified feedback signals and conveys the generated feedback signals to the adaptive network.

12. The system of claim 1, wherein:
the feedback signal comprises a direct current (DC) voltage,
the measured scattering parameter is a derivative of magnitudes of values of a reflection scattering parameter over a period of time, and
the processor identifies the DC voltage to obtain a minimum value for the measured scattering parameter.

13. The system of claim 1, wherein the stimulus signal comprises a background signal of the input electromagnetic signal.

14. The system of claim 1, wherein the stimulus signal comprises an out-of-band signal with respect to a frequency band of the input electromagnetic signal.

15. A method executed by an electronic system for matching impedance of an electrical component, configured to modify an input electromagnetic signal, that is electrically cooperating with an adaptive network comprising at least one tunable electrical element, in response to a stimulus signal, the method comprising:
coupling the stimulus signal to the adaptive network through a microwave coupler, the stimulus signal not interfering with the input electromagnetic signal;

decoupling a combined response to the stimulus signal by the electrical component and the adaptive network through the microwave coupler;

measuring a scattering parameter of the combined response to the stimulus signal by the electrical component and the adaptive network;

matching the measured scattering parameter with a predetermined parameter, and identifying, in accordance with the predetermined parameter, a feedback signal that corresponds to the predetermined parameter;

generating the identified feedback signal; and applying the feedback signal to the at least one tunable electrical element of the adaptive network so as to dynamically adjust impedance of the adaptive network to match desired impedance.

16. The method of claim 15, wherein:

the feedback signal comprises a direct current (DC) voltage combined with an alternating current (AC) dither voltage, the scattering parameter is a reflection scattering parameter, the method further comprising:
- measuring the reflection scattering parameter over a period of time,
- identifying, over the period of time, multiple feedback signals having respective DC voltages that minimize magnitudes of the reflection scattering parameter over the period of time,
- generating the identified feedback signals, and
- applying the generated feedback signals to the at least one tunable electrical element of the adaptive network.

17. The method of claim 15, wherein:

the feedback signal comprises a direct current (DC) voltage combined with an alternating current (AC) dither voltage, the scattering parameter is a reflection scattering parameter, the method further comprising:
- measuring the reflection scattering parameter over a period of time,
- identifying, over the period of time, multiple feedback signals having respective DC voltages that achieve a running average value of zero for magnitudes of the reflection scattering parameter over the period of time,
- generating the identified feedback signals, and
- applying the generated feedback signals to the at least one tunable electrical element of adaptive network.

18. A method executed by an electronic system for acquiring a desired response, by an electrical component that is electrically cooperating with an adaptive network, to an impinging electromagnetic signal, the method comprising:

measuring over a period of time a reflection scattering parameter indicative of a combined response by the electrical component and the adaptive network to the impinging electromagnetic signal;

identifying, in accordance with the measured reflection scattering parameter, multiple feedback signals that reduce a difference between a predetermined response and the combined response to the electromagnetic signal, wherein each feedback signal comprises a direct current (DC) voltage combined with an alternating current (AC) dither voltage;

generating an error signal of errors between DC voltages of the multiple feedback signals generated over the period of time and magnitudes of measured values of the reflection scattering parameter over the period of time;

identifying, over the period of time, the multiple feedback signals having the respective DC voltages so as to maximize a second harmonic of a dither frequency within the error signal;

generating the identified feedback signals; and applying the generated feedback signals to the adaptive network so as to dynamically adjust an electrical characteristic of the adaptive network to acquire the desired response.

19. The method of claim 18, further comprising reducing the DC voltage within the corresponding identified feedback signal when the reflection scattering parameter has a positive phase and increasing the DC voltage within the corresponding identified feedback signal when the reflection scattering parameter has a negative phase.

20. The method of claim 18, wherein the adaptive network comprises one of a pin diode, a tunable capacitor, a varactor or a variable-length transmission line tuner to be dynamically adjusted.

* * * * *